(12) United States Patent
Rieuvernet

(10) Patent No.: US 6,175,076 B1
(45) Date of Patent: Jan. 16, 2001

(54) CASING GASKET

(75) Inventor: Pierre Rieuvernet, Montbonnot St. Martin (FR)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/345,064

(22) Filed: Jun. 30, 1999

(30) Foreign Application Priority Data

Mar. 1, 1999 (EP) .................................................. 99400516

(51) Int. Cl.[7] .................................................. H05K 5/00
(52) U.S. Cl. .............................. 174/17 CT; 174/35 GC; 361/816
(58) Field of Search ................ 174/17 CT, 35 GC, 174/35 R; 361/816, 818

(56) References Cited

U.S. PATENT DOCUMENTS

| | | | |
|---|---|---|---|
| 3,277,230 | * 10/1966 | Stickney et al. | 174/35 GC |
| 4,572,921 | * 2/1986 | May et al. | 174/35 GC |
| 4,659,869 | 4/1987 | Busby . | |
| 4,761,516 | * 8/1988 | Reichert | 174/35 GC |
| 5,015,802 | 5/1991 | Chi . | |
| 5,039,825 | * 8/1991 | Samarov | 174/35 GC |
| 5,897,808 | * 4/1999 | Kim | 219/741 |
| 5,981,871 | * 11/1999 | Trumble et al. | 174/35 GC |

FOREIGN PATENT DOCUMENTS

2257839 * 1/1993 (GB) .............................. 174/35 GC

* cited by examiner

Primary Examiner—Kristine Kincaid
Assistant Examiner—Dhiru R Patel

(57) ABSTRACT

A casing gasket is described for providing a spatial contact and an electrical connection between first and second pieces of a casing for electronic equipment, the gasket including an electrically conductive resilient body of substantially C-shaped cross-section for grasping opposite sides of a panel on said first piece of said casing. The body has a first limb for engaging one side of the panel and a second limb for engaging the other side of the panel. A contact portion is provided on the convex side of the body. The body is shaped so that a lateral contact force applied to said contact portion by said second piece of said casing being brought into overlapping relation with said panel causes the body to pivot with respect to said panel so that the movement of the contact portion is made up not only of the elastic deformation of the body, but also by the pivotal motion of the body with respect to the panel.

13 Claims, 4 Drawing Sheets

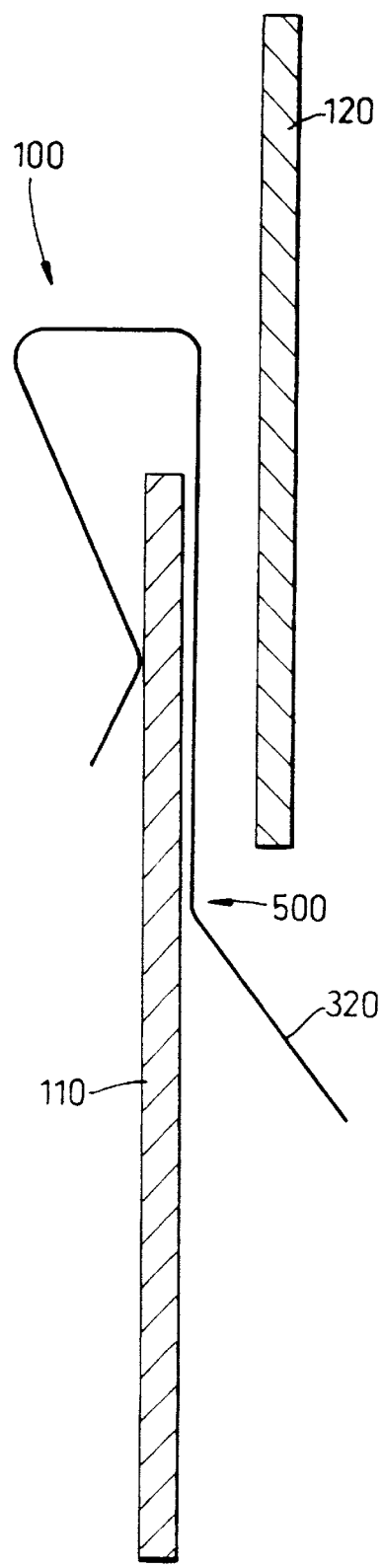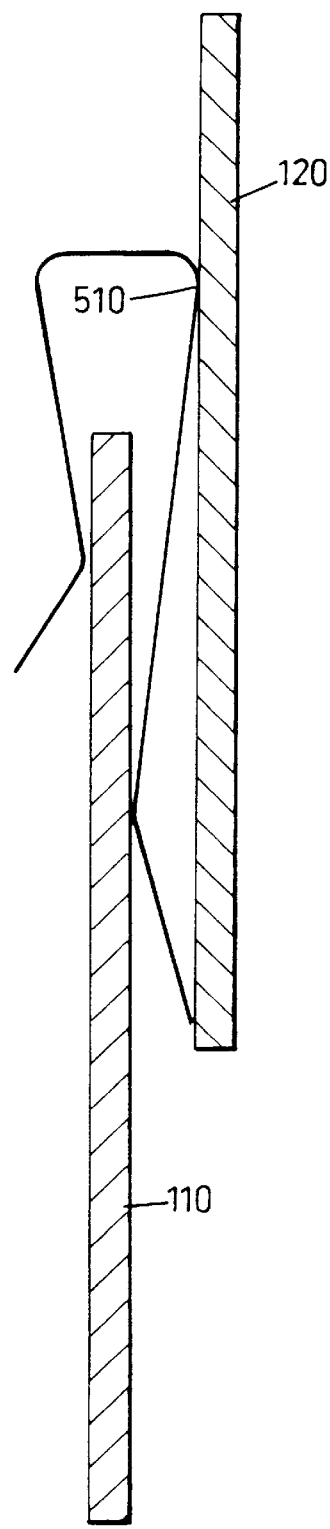
*Fig. 5A*  *Fig. 5B*

CASING GASKET

FIELD OF THE INVENTION

The present invention relates to a casing gasket for providing a spatial contact and an electrical connection between first and second pieces of a casing for electronic equipment, particularly, but not exclusively, for computers.

BACKGROUND OF THE INVENTION

As is well known, electronic devices generate electromagnetic emissions. These emissions are undesirable for a number of reasons, in particular since they may interfere with other electronic devices, such as telephones, televisions and radios. In consequence, it is conventional to use a metallic casing to cover and shield many types of electronic apparatus.

Personal computers, being electronic devices, are no exception to this rule. Personal computers generate unwanted electromagnetic emissions and the faster the processor, the worse is the interference problem. Standards have been established by the Federal Communications Commissions (FCC) and other standard setting bodies which strictly limit the amount of EMI emitted from electronic devices. Meeting these standards in a cost-effective way is a significant technical challenge.

Whilst the use of a metallic casing can be effective in reducing unwanted emission of electromagnetic radiation, at high frequencies further measures are necessary to keep EMI emissions down to the required levels. Modern personal computers use clock speeds of 200 MHz or more. Digital circuits operating at this speed can cause electromagnetic radiation to be emitted at frequencies in excess of 1 GHz. At such high frequencies, the wavelength of the emitted radiation can be such that the joints between different pieces of a casing can be a weak point where small gaps can allow electromagnetic radiation to leak out.

To alleviate this problem, an EMI gasket or sealing strip can be used in order to provide a tight spatial contact and an electromagnetic connection between two mating pieces of a casing. Examples of this kind of gasket can be found in U.S. Pat. No. 4,659,869 and U.S. Pat. No. 5,015,802.

Many different types of such gaskets are commercially available for different applications. Whilst these are generally satisfactory, they do suffer from a number of drawbacks.

Typically, the gaskets that are used in personal computers are made of resilient beryllium copper and, commonly need to be fixed in place using some kind of adhesive. This material is relatively expensive and the very thin sheets of the material which are used can have sharp edges. These sharp edges can lead to safety problems both in manufacturing and in the use of the device concerned. The need to use an adhesive to fix the gasket complicates the manufacturing process and can lead to difficulties in disposing of or recycling the apparatus at the end of its useful life. Moreover, if the gasket is made from a different metal than the casing itself, problems can arise due to chemical reaction between the two different metals in the gasket and the casing.

Another problem with conventional gaskets is that it is often difficult to avoid stressing the resilient material of the gasket beyond its elastic limit. This can lead to an irreversible deformation or crushing of the gasket which reduces the effectiveness of the shielding once the casing has been opened and closed a few times. This latter problem is particularly acute in the case of personal computer casings, since these are usually designed so that option cards of various types can be mounted and removed by a user to the interior of the casing. In contrast to other types of electronic apparatus, such as video or audio equipment, a personal computer casing may need to be opened and closed many times during its life.

The object of this invention is to provide a simple reduced-cost casing gasket design which mitigates the above drawbacks.

SUMMARY OF THE INVENTION

In brief, this is achieved by a casing gasket for providing a spatial contact and an electrical connection between first and second pieces of a casing for electronic equipment, the gasket comprising an electrically conductive resilient body of substantially C-shaped cross-section for grasping opposite sides of a panel on said first piece of said casing. The body has a first limb for engaging one side of the panel and a second limb for engaging the other side of the panel. A contact portion is provided on the convex side of the body. The body is shaped so that a lateral contact force applied to said contact portion by said second piece of said casing being brought into overlapping relation with said panel causes the body to pivot with respect to said panel so that the movement of the contact portion is made up not only of the elastic deformation of the body, but also by the pivotal motion of the body with respect to the panel.

Since the motion of the contact portion is made up in part by the pivotal motion of the body with respect to the panel, the gasket can be manufactured from a much less resilient material than is usual, such as steel, and the sheet from which the gasket is formed can be made thicker. In the preferred embodiment, for instance, the gasket is formed from sheet steel of 0.4 mm thickness. Since the casing, at least for computers, is also usually made of steel, the chance of chemical reaction between different metals is reduced.

Suitably, the pivotal engagement of the first limb of the gasket and the panel can be provided by a hook portion on the first limb for engaging an opening in the panel. This provides a convenient way of allowing the gasket to clip onto the panel, thus avoiding the need for the use of adhesive.

In a preferred embodiment, the gasket includes a portion of generally concertina configuration for providing an elastic deformation. If this concertinaed portion is disposed so as to have a concavity opposite the hook portion, a structure is formed which guides the panel into position, thereby allowing easy and convenient assembly of the gasket onto the panel.

Conveniently the gasket can comprise locating means, suitably a tongue extending into the concave side of the body, for locating the body with respect to the panel.

BRIEF DESCRIPTION OF THE DRAWINGS

Casing gaskets embodying the invention will now be described, by way of non-limiting example, with reference to the accompanying diagrammatic drawings, in which:

FIGS. 5A and B are cross sectional views of an alternative embodiment of the casing gasket

BEST MODE OF CARRYING OUT THE INVENTION

Figure 1:
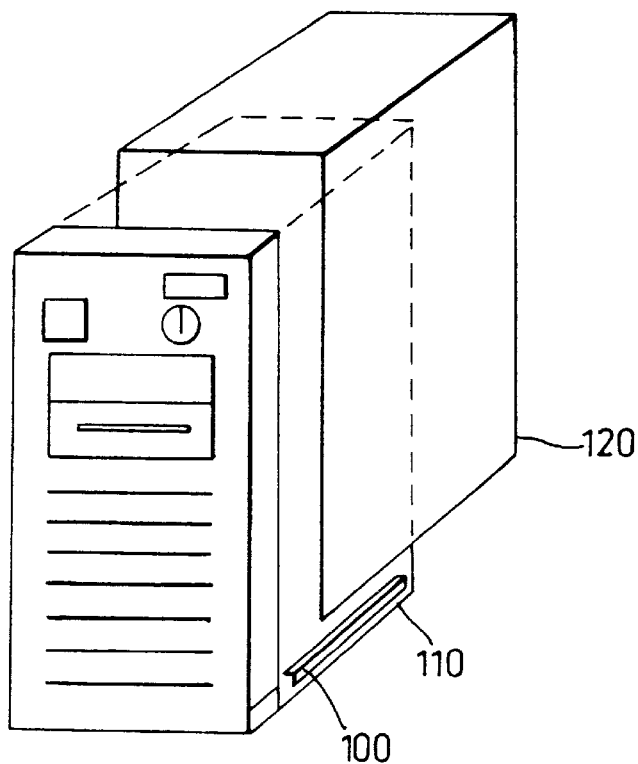
FIG. 1 is an exploded view of a computer casing having a casing gasket.

FIG. 1 shows a personal computer casing, having a conventional minitower configuration, in which a casing gasket 100 is used to provide a spatial contact and an electrical connection between overlapping panels of a base panel 110 and a cover panel 120 of the case, both of which are made of sheet steel.

The general configuration and the manner in which base panel 110 and cover panel 120 of these types of computer cases normally engage is well known to those skilled in the art and need not be described in detail herein.

Figure 2:
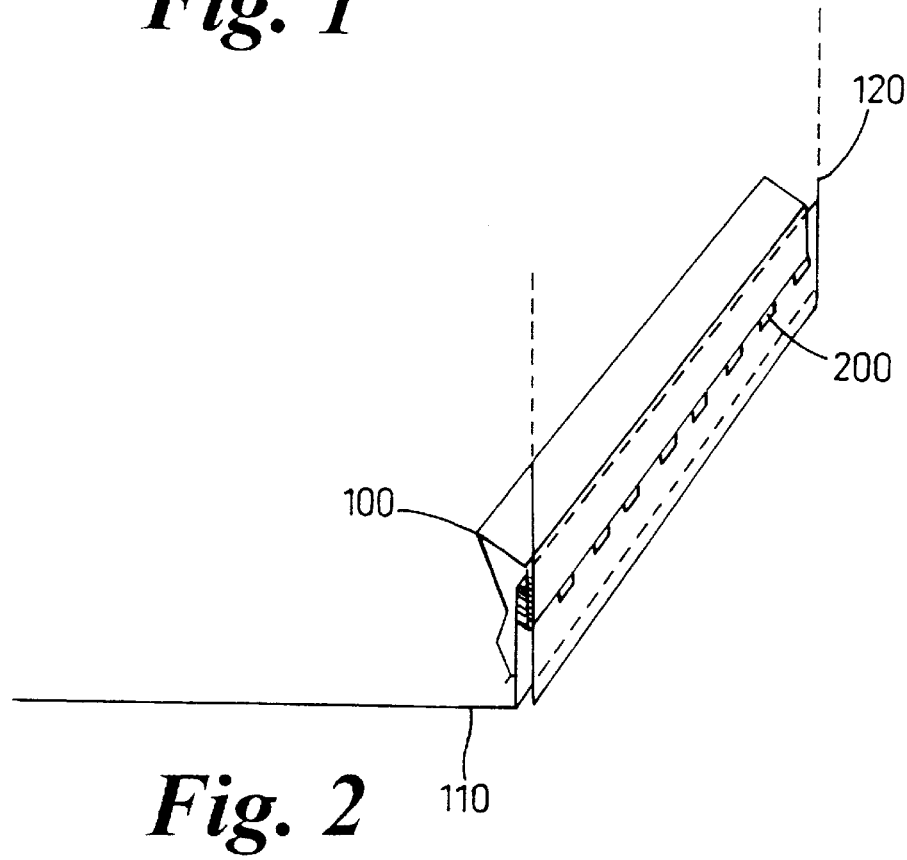
FIG. 2 is a view of the casing gasket in the computer casing of FIG. 1.

The overlapping panels and the disposition of casing gasket 100 can be seen more clearly in FIG. 2. Of course it will understood that the gaskets described may be used in any type of case which includes similarly overlapping panels.

FIGS. 3A and B are cross-sectional views showing the casing gasket 100 and showing its movement when the cover panel 120 is brought into contact with the base panel 110.

Figure 3:
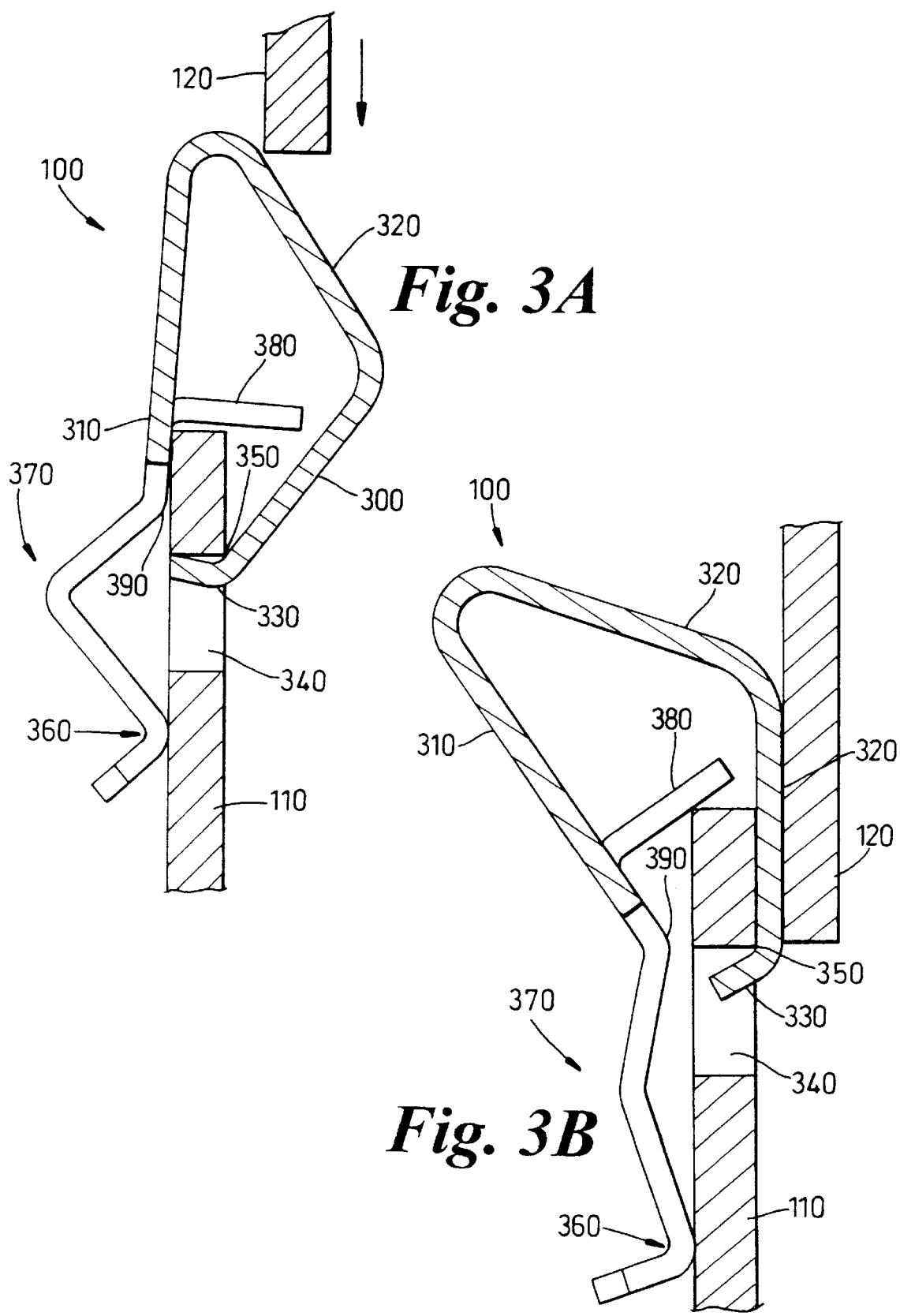
FIGS. 3A and B are cross sectional views of the casing gasket in two positions.

As can be seen from FIGS. 2 and 3, casing gasket 100 has a generally C-shaped cross-section with two limbs 300 and 310 that grasp opposite sides of the base panel 110.

In this embodiment, casing gasket 100 is made of sheet steel having a thickness of 0.4 mm. This material is resilient to a certain extent, but as will be described below the resilience of the material need not be such as to absorb the full movement of the casing 100 base and cover gasket when panels 110 and 120 are brought into overlapping relation since such movement is made up not only of the elastic deformation of casing gasket 100, but also by its rotation with respect to base panel 110.

To provide an electrical contact between base panel 110, cover panel 120 and casing gasket 100, a flat contact portion 320 is provided on the convex side of casing gasket 100. One of the limbs 300 includes a hook portion 330 at its end which engages an opening 340 in the panel. In this way, casing gasket 100 can pivot about the corner 350 of opening 340. The other limb 310 includes a slide portion 360 which slides on base panel 110 as casing gasket 100 pivots. Since the gasket material is relatively stiff, part of the gasket 370 is of generally concertina configuration for providing sufficient elastic deformation as casing gasket 100 pivots. It is not essential in all embodiments that slide portion 360 slide to any great degree with respect to the panel base 110, rather in some embodiments the motion may be a pivoting of casing gasket 100 around point 360 with no, or only minimal, sliding. It will appreciated that many variants are possible depending on the exact profile of the casing gasket 100.

Tongue 380 is provided for locating casing gasket 100 with respect to the base panel 110. Since concertinaed portion 370 is disposed so as to have a concavity opposite hook portion 330, a structure is formed by portion 370, hook 330 and tongue 380 which guides base panel 110 into position, thereby allowing easy and convenient assembly of the casing gasket 100 onto the base panel 110.

Figure 4:
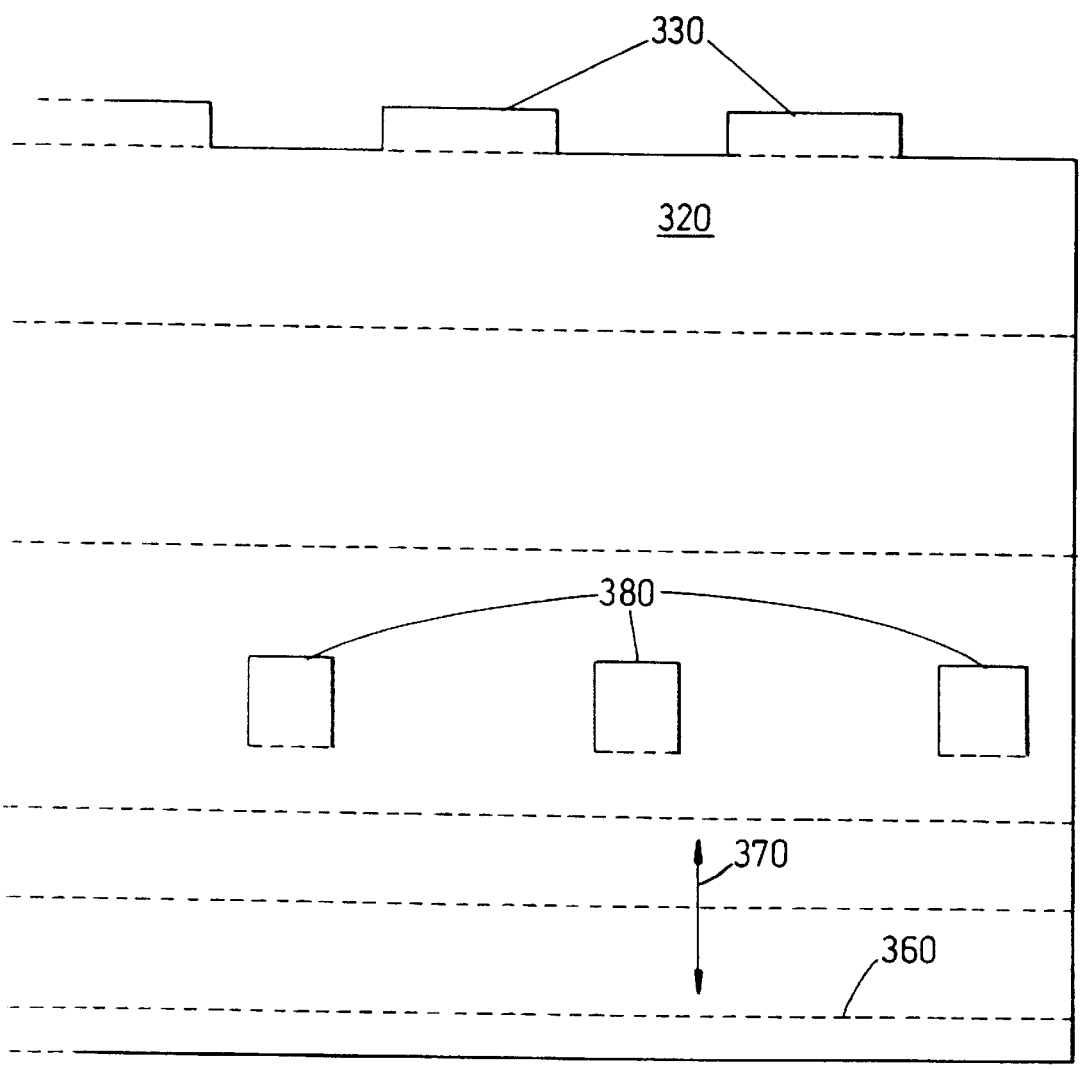
FIG. 4 shows a stamped metal part used to produce the casing gasket.

In practical embodiments where casing 100 is relatively long, a plurality of tongues 380 and hooks 330 may be provided spaced along the length of the gasket as illustrated in FIG. 4 which shows a portion of a stamped metal part that can be used to produce the casing gasket—fold lines being shown in phantom. The hooks 330 may engage a corresponding series of slots—indicated at 200 on FIG. 2—spaced along the edge of base panel 110.

When cover panel 120 is not engaged with base panel 110, casing gasket 100 is mounted on base panel 110 in the position shown in FIG. 3A. As cover panel 120 is brought into overlapping relation with base panel 110, casing gasket 100 moves into the position shown in FIG. 3B.

As can be seen from FIGS. 3A and 3B, the lateral contact force applied to contact portion 320 by cover panel 120 in engaging base panel 110 causes casing gasket 100 to pivot with respect to said base panel 110 so that the movement of the contact portion is made up not only of the elastic deformation of the body in the region 370, but also by the pivotal motion of the body about point 350. As casing gasket 100 moves from the position shown in FIG. 3A to the position shown in FIG. 3B, slide portion 360 slides on base panel 110.

To allow the elastic deformation of the casing gasket 100 to be taken up by concertina portion 370, the cross-section is such that corner 390 lifts away from base panel 110 as the casing gasket 100 rotates, slide portion 360 being the only point of contact on that side of base panel 110.

FIGS. 5A and B illustrate a simpler alternative embodiment of the invention in which casing gasket 100 has the same basic C-shaped cross-section for grasping opposite sides of base panel 110. Contact portion 320 is in the embodiment located between a pivot point 500 on one of the limbs and the end of that limb. A lateral contact force applied to contact portion 320 by cover panel 120 being brought into overlapping relation with said base panel 110 causes casing gasket 100 to pivot about point 500 towards cover panel 120. As before, the movement of contact portion 320 is made up not only of the elastic deformation of the casing gasket 100, but also by the pivotal motion of the body with respect to the base panel 110. In the embodiment illustrated in FIGS. 5A and 5B contact is also made between the casing gasket 100 and cover panel 120 at point 510, although this need not be the case.

Although specific embodiments of the invention have been described, the invention is not to be limited to the specific arrangements so described. The invention is limited only by the claims.

What is claimed is:

1. A casing gasket for providing a spatial contact and an electrical connection between first and second pieces of a casing for electronic equipment, the gasket comprising an electrically conductive resilient body of substantially C-shaped cross-section for grasping opposite sides of a panel on said first piece of said casing, the body having a first limb for engaging one of said sides of the panel and a second limb for engaging other of said sides of the panel, and a contact portion on a convex side of the body whereby a lateral contact force applied to said contact portion by said second piece of said casing being brought into overlapping relation with said panel causes the body to pivot with respect to said panel so that a movement of the contact portion is made up not only of an elastic deformation of the body, but also by a pivotal motion of the body with respect to the panel.

2. A gasket as claimed in claim 1 wherein the first limb includes a hook portion for engaging an opening in the panel so as to provide a pivotal engagement.

3. A gasket as claimed in claim 2 wherein the second limb includes a slide portion for sliding on said other side of said panel.

4. A gasket as claimed in claim 3 including a portion having a concertina configuration for providing said elastic deformation, the slide portion being disposed between the concertina portion and an end of the second limb.

5. A gasket as claimed in claim 4 wherein the concertina portion has a concavity opposite the hook portion so as to form a structure for guiding the panel into position.

6. A gasket as claimed in claim 1, further comprising locating means for locating the body with respect to the panel.

7. A gasket as claimed in claim 6 wherein the locating means is a tongue extending into a concave side of the body.

8. A gasket as claimed in any claim 1 wherein the contact portion is located on said first limb.

9. A casing gasket as claimed in claim 1 wherein the gasket is formed from a steel sheet having a thickness of at least 0.4 mm.

10. A computer case including a casing gasket as claimed in claim 1.

11. A casing gasket for providing a spatial contact and an electrical connection between first and second pieces of a casing for electronic equipment, the gasket comprising a body formed from a steel sheet having a thickness of at least 0.4 mm, the body being of substantially C-shaped cross-section for grasping opposite sides of a panel on said first piece of said casing, the body having a first limb including a hook portion for engaging an opening in the panel so as to provide a pivotal engagement with one of said sides of the panel and a second limb for slidably engaging other of said sides of the panel, the second limb including a portion having a concertina configuration for providing an elastic deformation and slide portion being disposed between the concertina portion and [the] an end of the second limb, the body comprising a contact portion located on said first limb on a convex side of the body whereby a lateral contact force applied to said contact portion by said second piece of said casing being brought into overlapping relation with said panel causes the body to pivot with respect to said panel so that a movement of the contact portion is made up not only of the elastic deformation of the body, but also by a pivotal motion of the body with respect to the panel.

12. A gasket as claimed in claim 11 further comprising locating means for locating the body with respect to the panel.

13. A gasket as claimed in claim 12 wherein the locating means is a tongue extending into a concave side of the body.

\* \* \* \* \*